US011555745B2

(12) United States Patent
Verellen et al.

(10) Patent No.: US 11,555,745 B2
(45) Date of Patent: Jan. 17, 2023

(54) METHOD AND DEVICE FOR GENERATING (QUASI-) PERIODIC INTERFERENCE PATTERNS

(71) Applicants: IMEC VZW, Leuven (BE); Katholieke Universiteit Leuven, KU LEUVEN R&D, Leuven (BE)

(72) Inventors: Niels Verellen, Heverlee (BE); Dmitry Kouznetsov, Korbeek-lo (BE); Pol Van Dorpe, Spalbeek (BE)

(73) Assignees: IMEC VZW, Leuven (BE); Katholieke Universiteit Leuven, KU Leuven R&D, Leuven (BE)

( * ) Notice: Subject to any disclaimer, the term of this patent is extended or adjusted under 35 U.S.C. 154(b) by 94 days.

(21) Appl. No.: 17/224,466

(22) Filed: Apr. 7, 2021

(65) Prior Publication Data

US 2021/0325254 A1    Oct. 21, 2021

(30) Foreign Application Priority Data

Apr. 16, 2020   (EP) ..................... 20169757

(51) Int. Cl.
*G01J 9/02* (2006.01)
*G01N 21/64* (2006.01)
*G02B 21/16* (2006.01)

(52) U.S. Cl.
CPC ............ *G01J 9/02* (2013.01); *G01N 21/6458* (2013.01); *G02B 21/16* (2013.01); *G01J 2009/0269* (2013.01)

(58) Field of Classification Search
CPC ............... G01J 9/02; G01J 2009/0269; G01N 21/6458; G02B 21/16
See application file for complete search history.

(56) References Cited

U.S. PATENT DOCUMENTS 8,259,106 B2 *   9/2012   Dammertz ............ G06T 11/001
                                                    345/582
8,351,020 B2 *   1/2013   Sandstrom ............ G06K 17/00
                                                    355/77
(Continued)

FOREIGN PATENT DOCUMENTS

EP     3581919 A1    12/2019

OTHER PUBLICATIONS

Extended European Search Report and Written Opinion, EP Application No. 20169757.0, dated Nov. 9, 2020, 5 pages.
(Continued)

*Primary Examiner* — Jonathan M Hansen
(74) *Attorney, Agent, or Firm* — McDonnell Boehnen Hulbert & Berghoff LLP (57) ABSTRACT

Example embodiments relate to methods and devices for generating (quasi-) periodic interference patterns. One embodiment includes a method for generating an interference pattern using multi-beam interference of electromagnetic radiation. The method includes computing a set of grid points in a complex plane representing a grid with a desired symmetry. The method also includes selecting a radius of a virtual circle. Additionally, the method includes selecting a set of grid points in the complex plane that lies on the virtual circle centered around a virtual center point. Further, the method includes associating an argument of each grid point of the selected set of grid points in the complex plane with a propagation direction of plane waves or quasi plane waves or parallel wave fronts. In addition, the method includes obtaining the interference pattern that is a superposition of the plane waves or quasi plane waves or parallel wave fronts.

20 Claims, 9 Drawing Sheets

(56) References Cited

U.S. PATENT DOCUMENTS

| | | | | |
|---|---|---|---|---|
| 9,019,468 B2* | 4/2015 | Burrow | ............... | G03F 7/70208 355/71 |
| 2007/0109320 A1* | 5/2007 | Skibak | ................. | G06T 11/001 345/611 |

OTHER PUBLICATIONS

Li, Enbang, Jiangtao Xi, and Joe Chicharo. "Predication of multi-dimensional photonic crystal structures generated by multi-beam interference in holographic lithography." Smart materials and structures 15, No. 1 (2005): S158.

Vala, M., and J. Homola. "Multiple beam interference lithography: A tool for rapid fabrication of plasmonic arrays of arbitrary shaped nanomotifs." Optics express 24, No. 14 (2016): 15656-15665.

Terhalle, Bernd, Andreas Langner, Birgit Päivänranta, and Yasin Ekinci. "Advanced holographic methods in extreme ultraviolet interference lithography." In Nanoengineering: Fabrication, Properties, Optics, and Devices VIII, vol. 8102, p. 81020V. International Society for Optics and Photonics, 2011.

* cited by examiner

METHOD AND DEVICE FOR GENERATING (QUASI-) PERIODIC INTERFERENCE PATTERNS

CROSS-REFERENCE TO RELATED APPLICATIONS

The present application is a non-provisional patent application claiming priority to European Patent Application No. EP 20169757.0, filed Apr. 16, 2020, the contents of which are hereby incorporated by reference.

FIELD OF THE DISCLOSURE

The disclosure relates to illumination pattern generation in two- and three-dimensional systems and specifically to generation of (quasi-) periodic interference patterns of electromagnetic radiation.

BACKGROUND

The interference of multiple beams of electromagnetic radiation (e.g. electromagnetic radiation such as light, infrared, radio waves, microwaves, deep UV, etc) can give rise to complex intensity patterns that find application in several fields. For instance, multi-beam interference lithography (MBIL) has the flexibility to produce maskless high-resolution periodic patterning. This can reduce the feature size with large-area periodic nanoscale patterning. Several other technologies, such as photonic crystal technology, metamaterials, biomedical structures, subwavelength structures, optical traps, and optical tweezers can be developed or improved by advances in multi-beam interference (MBI) technologies.

As an extension, the generation of arbitrary (quasi-) periodic radiation interference patterns, e.g. using MBI, enables the fabrication of precise microstructures such as photonic crystals, plasmonic quasicrystals, micro-lens arrays, and fiber Bragg gratings. Other relevant application fields of (quasi-) periodic light patterns are optical traps for cold atoms, high-resolution and patternable photo-chemistry activation, optical lattices for quantum sensing and quantum computing, 3D printing, 3D surface imaging, and microscopy, such as multi-focal scanning laser microscopy and spectroscopy.

Generally, structured radiation patterns are generated by orienting multiple beams such that the structured radiation pattern is formed in the region where the beams intersect (multi-beam interference, MBI). Some of the ways to realize the interfering beams include non-linear materials, phase masks, and intricate light polarization schemes.

U.S. Pat. No. 9,019,468 B2 relates to an interference projection exposure system and a method of using the same for generating periodic illumination patterns. The interference projection exposure system comprises a beam-providing subsystem and an objective lens subsystem. A beam providing subsystem is configured to provide a plurality of light beams and the objective lens subsystem is configured to receive the plurality of light beams such that the plurality of light beams intersect and interfere at the image plane to produce illumination pattern.

However, it remains silent regarding a method or configuration used for achieving non-trivial illumination patterns. Trivial here is to be understood as either non-periodic speckle patterns (an example can be seen in FIG. 1B), or periodic patterns with periodicity on the order of a wavelength or half a wavelength of the used radiation. It is not described how to choose the parameters of the incident beams or their relation to the resulting interference (light) patterns.

In fluorescence microscopy, an essential tool in engineering, medical sciences, physical sciences, and biological sciences, structured light patterns provide a major impact on imaging resolution by enabling down-modulating spatial frequencies of microscopic structures in techniques such as Structured Illumination Microscopy enabling resolution below the diffraction limit, enable multi-focal scanning laser microscopy or spectroscopy.

Conventionally, fluorescence microscopy involves bulky lens-based optical microscopes, where the resolving power is provided by the lens or objective lens. Recent years have seen a strong effort towards miniaturization of microscopy by eliminating many of the conventional free-space optical components, such as the lens. Non-trivial, custom structured light patterns can provide efficient and affordable solutions to image objects without the use of bulky optical components.

Patent application EP 3 581 919 A1 relates to an imaging apparatus and a method for imaging an object. This document relates to enabling lens-free sub-pixel resolution imaging of objects using a compact imaging set up consisting of a planar photonic integrated circuit on a pixel sensor array. However, it remains open regarding a method used for achieving the desired illumination pattern.

None of the prior art discloses any method for illumination pattern generation or system that may be applied in a two-dimensional system such as the above described planar photonic integrated circuit, that is, input beams and a generated illumination interference pattern are on the same plane.

Some optical techniques such as super-resolution STED microscopy make use of annular-shaped focused spots instead of Gaussian spots. No methods to create arrays of such spots in a two-dimensional multi-beam interference setup have been realized in literature.

SUMMARY

The present disclosure provides a method, a computer program with programming code, and a device to generate an interference pattern of electromagnetic radiation having a periodicity that is larger than two times the spot size of the high-intensity spots, and high sideband suppression, meaning low-intensity peaks in the interstitial area, with interstitial meaning in between the high-intensity spots forming the periodic pattern. In the two-dimensional case, the high-intensity spots have a spot size that is close to, or below, the diffraction limits.

The above is addressed by the features of independent claim 1. The dependent claims contain further developments.

A first aspect of the disclosure provides a method for generating an interference pattern using multi-beam interference of electromagnetic radiation. The method according to the present disclosure comprises the step of computing a set of grid points in a complex plane representing a grid with a desired symmetry. This symmetry can be, for example, triangular, hexagonal, square, rectangular, or quasi-periodic. In terms of number theory, the grid points may be related to an integer lattice where the norm of an integer can be related to the radius of a virtual circle.

The method further comprises the step of selecting a radius of a virtual circle, selecting a set of grid points in the complex plane that lies on the virtual circle centered around a virtual center point, associating the argument of each grid point of the selected set of grid points in the complex plane, with a propagation direction of plane waves or quasi plane waves or parallel wavefronts, and obtaining the interference pattern that is a superposition of the plane waves or quasi plane waves or parallel wavefronts.

The approach of the present disclosure is linked to rotational Moiré patterns.

In some embodiments, the obtained interference pattern is a periodic pattern or quasi-periodic and can be understood as a rotational Moiré mapping, that is, by superposition of multiple periodic interference patterns rotated by twist angles. The presently disclosed method for generating an interference pattern describes how to calculate such twist angles to obtain non-trivial, custom interference patterns.

The grid points and the virtual circle may be in a complex plane. The grid points laying on the virtual circle forms the set of selected grid points. In terms of number theory, the radius may be related to the field norms and the grid points to an integer lattice.

In some embodiments, the method further comprises the step of shifting a phase angle to modulate the plane waves or quasi plane or parallel wave fronts. Doing so, the interference pattern is still formed by the superposition of the plane waves, and allows modulating the interference pattern.

Further, in some embodiments, the method comprises the steps of calculating the radiation intensity of the illumination spots of the interference pattern and determining if the interference pattern has a desired symmetry and/or sideband suppression, and/or sparsity of the interference spots. According to the present disclosure, the illumination spots correspond to the constructive interference spots with highest intensity, which are arranged periodically or quasi-periodically.

According to the present disclosure, an interference pattern with single intensity peaks (spots) has high sideband suppression, meaning low intensity peaks in interstitial area, with interstitial meaning in between the high intensity spots forming the periodic or quasi-periodic pattern. Therefore, by example, it offers high contrast and high signal to background imaging. In the context of the present disclosure, contrast is defined as the ratio of field intensity at the illumination spots to the maximum intensity in the interstitial spots or regions (i.e., the space between the illumination spots).

In some embodiments, the method comprises the step of tuning the symmetry of the array of grid points to obtain a desired symmetry of the interference spot positions. This symmetry can be for example triangular or hexagonal or square or rectangular or quasi-periodic.

In some embodiments, the method comprises the step of tuning the distance between the illumination spots by tuning the radius of the virtual circle or the angle of incidence of the light beams. Tuning the distance between the illumination spots for practical applications is useful, since the illumination spots may correlate to pixels of any detector in an imaging application, to a variety of fluorescent arrays or a variety of microwell or nanowell arrays, or to the desired pattern in a lithography or optical tweezer or photochemistry or other application.

In some embodiments, the method comprises the step of tuning the interstitial spots which can be achieved by tuning the radius of the virtual circle or the angle of incidence of the light beams or tuning the angle of incidence of the light beams or tuning the phase angle of the input beams. Especially, the tunable interstitial regions allow the illumination spots to have high contrast and high signal to background ratio for applications such as imaging, lithography, optical tweezers, and photochemistry.

The method may further comprise the step of arranging at least partially coherent input beams of electromagnetic radiation such that they have a direction of the wavefront that is the argument of the selected grid points on the selected virtual circle. In some embodiments, the structured illumination pattern may be formed in the region where the beams intersect.

In some embodiments, the method comprises the steps of tuning the angle of incidence of the input beams and/or modulation of phases or amplitudes of the input beams to manipulate the illumination spots.

In some embodiments, the method comprises the step of determining phase shifts of the input beams by multiplying the projection of each selected grid point, corresponding to an orientation angle of each of the input beams, on an axis perpendicular to a desired direction of an intended translation of the interference pattern by the magnitude of the intended translation.

In some embodiments, the method comprises the step of changing the interference pattern dynamically by modulating the phases, and/or angle of incidence, and/or amplitudes of the input beams. In some embodiments, this method may allow control and modification of the position of the interference pattern, its periodicity, and its orientation.

In some embodiments, the method comprises the step of tuning the phase of the plane waves or quasi plane waves or parallel wave fronts, as to give them a helical phase to obtain an annular interference spot.

The method according to the present disclosure can be extended to the step where a helical phase is applied to all grid points on the virtual circle that are equidistant on the circle, where a helical phase means that the phase angle for the input beam is equal to the argument of the grid point corresponding to that beam. This step changes the shape of the illumination spots from Gaussian shaped spots to annular spots. These annular spots can be used in multifocal Stimulated Emission Depletion (STED) microscopy.

The method according to the present disclosure can be extended to generate three dimensional patterns of illumination spots. Herein the virtual circle is a virtual sphere and the complex plane is a three-dimensional space and the interference pattern is a three-dimensional interference pattern of interference spots. These patterns can find applications, for example, in 3D lithography and 3D optical tweezer lattices.

A second aspect of the present disclosure relates to a computer program with programming code means in order to carry out all of the method steps discussed above to obtain the interference pattern with the desired symmetry, sparsity, and contrast when the program is executed on a computer or a digital processor.

An embodiment of a third aspect of the present disclosure provides a device to generate an interference pattern using the above-discussed method. The device comprises a plurality of electromagnetic radiation input ports configured to receiving input radiation beams and wherein the radiation beams interfere at a center generating an interference pattern. In some embodiments, the device allows the generation of the interference pattern over any desired region such as in free space or vacuum or a central region of the radiation propagating medium or any device, sample or material interface.

Another example embodiment of the third aspect of the present disclosure provides a device for the generation of the illumination spots using electromagnetic waves at optical frequencies. The device comprises a plurality of light input ports oriented around an optical waveguide for receiving input light beams, wherein the light input ports are configured to provide plane waves or quasi-plane waves or parallel wave fronts forming illumination spots by an interference pattern, which is generated by the method discussed above. The illumination spots illuminate a sample. The virtual center point of the illumination spots is associated with the center of the waveguide, and the detector is configured to detect light from an illuminated sample above the waveguide.

Further, the waveguide of the device may be a slab waveguide for guiding the plane wave or quasi plane waves or parallel light wave fronts or parallel wave fronts.

Further, the device may include at least one phase modulator and/or at least one switch (e.g. a Mach-Zehnder interferometer) for phase shifting and/or altering the magnitude of at least one of the input radiation beams at the radiation input ports. In some embodiments, phase and/or amplitude of each of the input beam can be controlled.

BRIEF DESCRIPTION OF THE DRAWINGS

Example embodiments are now further explained with respect to the drawings by way of example only, and not for limitation.

From here on, light can be interpreted as electro-magnetic radiation in general. In the drawings:

FIG. 1A shows a bead diagram with random placements of the grid points on a virtual circle, representing random directions of input beams, according to example embodiments.

FIG. 1B shows an arbitrary interference pattern in a real space corresponding to the beams associated with the grid points in FIG. 1A and the axes of the interference patterns in real space are in wavelength units $\lambda$ of the incident radiation beams, according to example embodiments.

FIG. 1C shows the bead diagram for the grid points selected with a random twist angle between two hexagonal base interference patterns, according to example embodiments.

FIG. 1D shows an interference pattern corresponding to the beams associated with the grid points in FIG. 1C and the axes of the interference patterns in real space are in wavelength units $\lambda$ of the incident radiation beams, according to example embodiments.

FIG. 4A shows a cardioid diagram with phase shifts projected towards the cardioid where phase shift can be positive ($\varphi>0$) or negative ($\varphi<0$) depending on the projection being away or towards the virtual circle center, according to example embodiments.

FIG. 4B shows the interference pattern before translation, according to example embodiments.

FIG. 4C shows translation (marked by a white arrow in the center of the pattern) of the interference pattern perpendicular to the orientation of the cardioid, according to example embodiments.

FIG. 5A shows the planar 2D beam arrangement, according to example embodiments.

FIG. 5B shows the generalized free space or 3D configuration, according to example embodiments.

FIG. 5C shows the interference of diffracted beams, according to example embodiments.

FIG. 5D shows the resulting interference pattern generated by multi-beam interference, according to example embodiments.

FIG. 8A shows a triangular grid with a set of grid points lying on a selected virtual circle encompassing the grid points, according to example embodiments.

FIG. 8B shows a simulated interference pattern using the FFT approach for the input beam arrangement corresponding to the grid points for the virtual circle with radius equal to $\sqrt{7}$ for field norm equal to n=7 in FIG. 8A, according to example embodiments.

FIG. 8C shows the experimental multi-beam interference pattern obtained from diffracted beams as obtained with example methods using the bead diagram in FIG. 8A and corresponding to the simulated interference pattern in FIG. 8B, according to example embodiments.

DETAILED DESCRIPTION

Reference will now be made in detail to example embodiments, which are illustrated in the accompanying drawings. However, the following embodiments may be variously modified and the range of the present invention is not limited by the following embodiments.

Figure 1A:
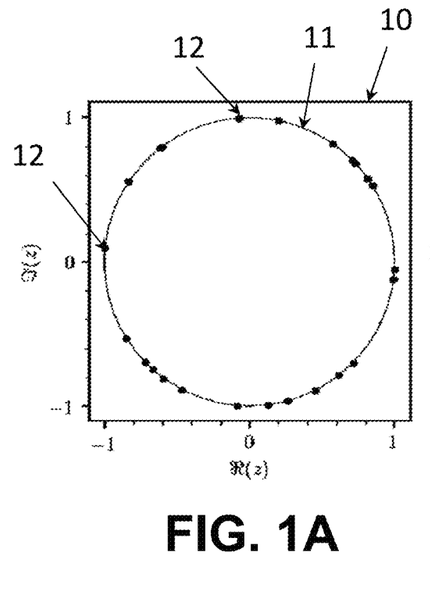
FIGS. 1A-1D show the general approach to interference pattern formation represented by a bead diagram, according to example embodiments.
Figure 1B:
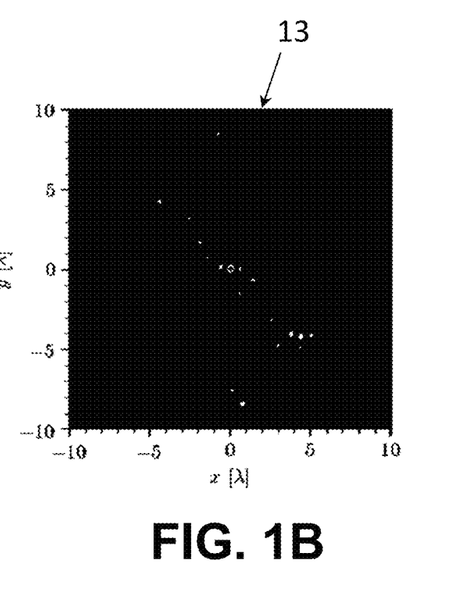
Figure 1C:
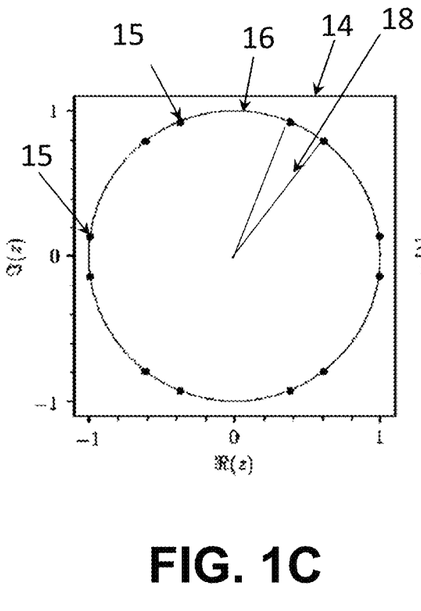
Figure 1D:
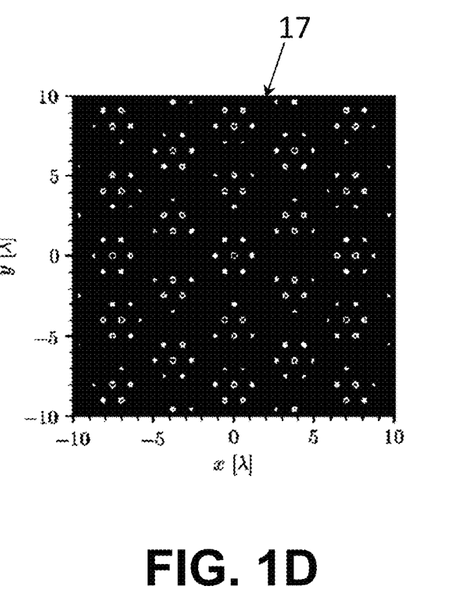

In FIGS. 1A-1D, the general approach to interference pattern formation represented by a bead diagram is illustrated. FIG. 1A shows the bead diagram 10 with a circle 11 on which lies a plurality of points 12. The argument of each of the points 12 on the circle 11 may correspond to a propagation direction of plane waves or quasi plane waves or parallel wave fronts. In FIG. 1A, the points 12 are selected randomly without any selection criteria. If the selected points of FIG. 1A are associated with the plane waves or quasi plane waves or parallel wave fronts it will result in an interference pattern 13 as shown in FIG. 1B. The obtained interference pattern 13 will have no clear periodic structure and resembles a speckle pattern in real space. The axes of the interference patterns in real space (FIGS. 1B and 1D) are in wavelength units λ of the incident electromagnetic radiation beams. Another example to illustrate the general approach to the interference pattern formation represented by a bead diagram is shown in FIGS. 1C and 1D. The bead diagram 14 in FIG. 1C illustrates the grid points 15 along the circle 16 in the complex plane. These grid points 12 are obtained from a random twist angle 18 of 52° between two hexagonal base interference patterns. Each hexagonal base interference pattern corresponds to an arrangement of six input radiation beams at equal distance around the circle. FIG. 1D shows the resulting interference pattern 17 in the real space corresponding to the bead diagram 14 of FIG. 1C, when associating the grid points 15 with plane waves or quasi-plane waves or parallel wave fronts. The obtained interference pattern shows indeed a resulting hexagonal Moiré superlattice, however, the unit cells are non-uniform and consist of multiple interstitial high intensity peaks (i.e. low quality unit cells).

Figure 2:
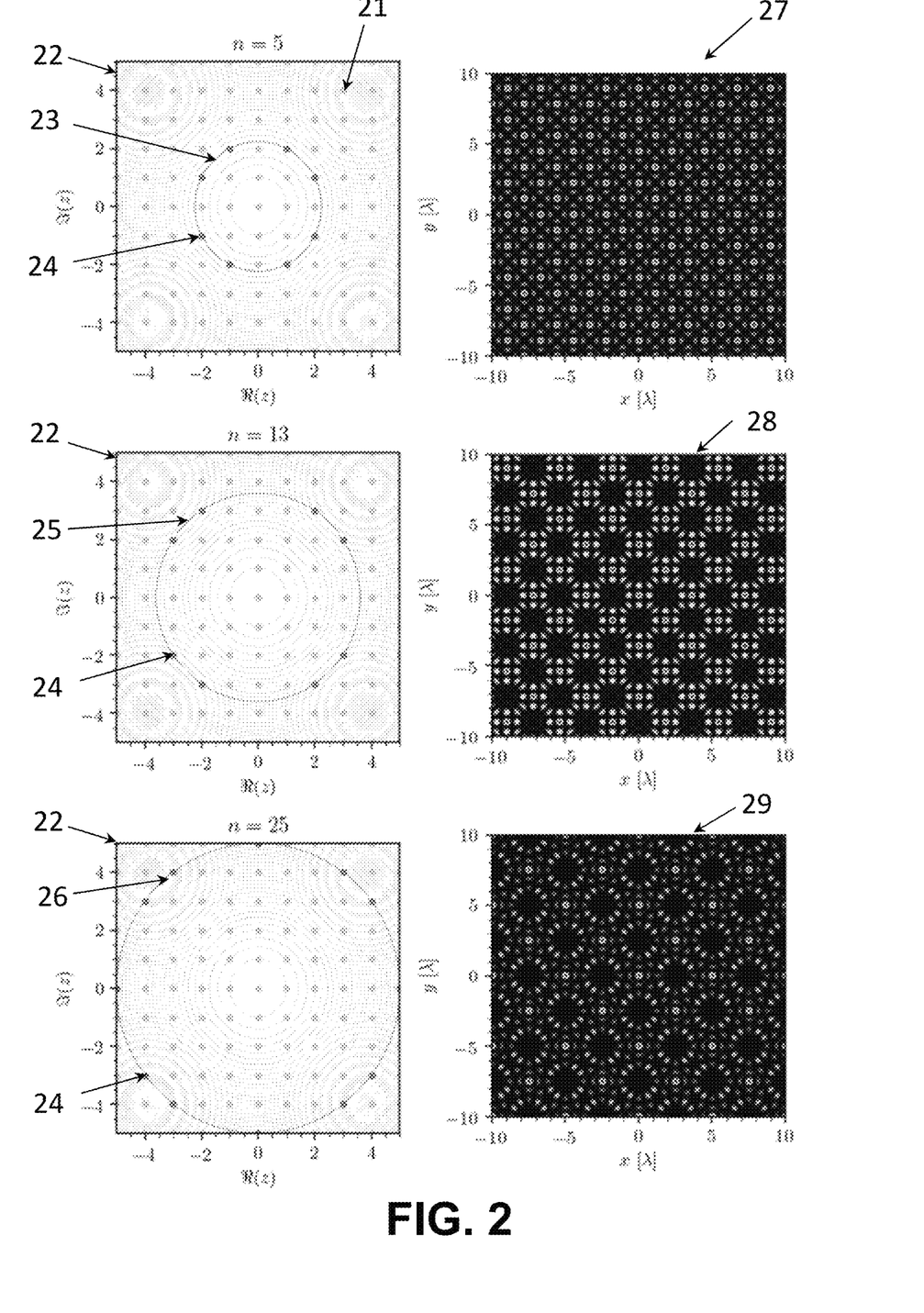
FIG. 2 shows the bead diagram for a square grid in the complex plane with virtual circles intersecting the grid points with field norm $-n=5, 13, 25$ and corresponding obtained interference patterns in real space, according to example embodiments.
Figure 3:
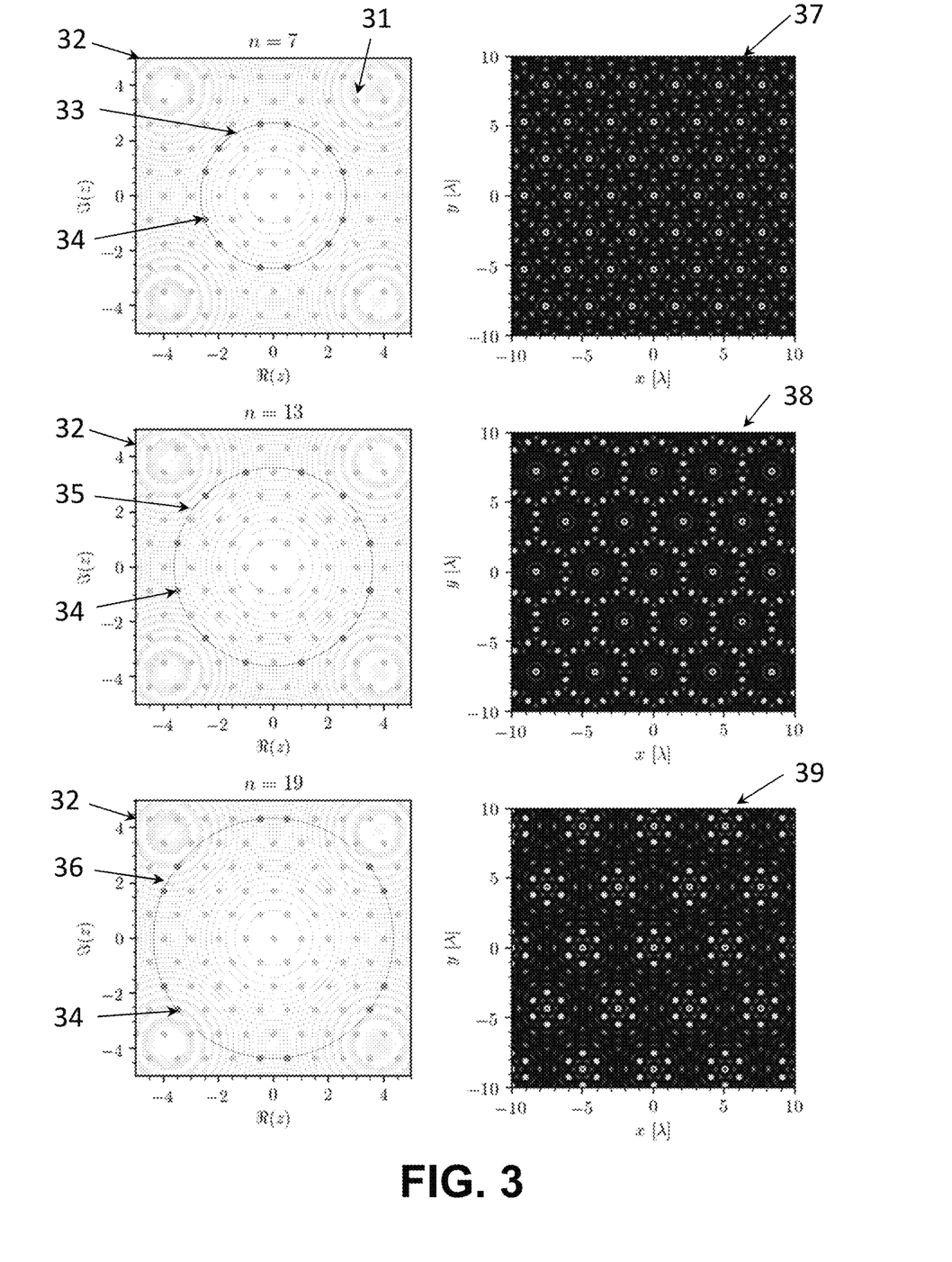
FIG. 3 shows the bead diagram for a hexagonal grid in a complex plane with virtual circles intersecting the grid points with field norm $n=7, 13, 19$ and corresponding obtained interference patterns in real space, according to example embodiments.

According to a first aspect, a method for generating an interference pattern using multi beam interference is provided. The method describes the steps in calculating orientations of input beams, such that the resulting interference pattern is periodic or quasi periodic with desired symmetry and with control over the interference spot intensity and their spacing. The method relies on computing grid points in the complex plane that lie on a virtual circle associated with the field norm. FIGS. 2 and 3 show the method for selecting a radius of a virtual circle, selecting a set of grid points in a complex plane that lies on the virtual circle centered around a virtual center point. According to the method, by associating each selected grid point with a propagation direction of plane waves or quasi plane waves the interference pattern is obtained. The obtained interference pattern is a superposition of the plane waves or quasi plane waves or parallel wave fronts.

FIG. 2 shows an array of grid points 21 in the complex plane with a square grid arrangement 22. A virtual circle 23, 25, 26 is selected among the available concentric circles. All the grid points that lay on one of the virtual circles 23, 25, 26 contribute to the selected grid points 24. Depending on the selected radius of the virtual circle 23, 25, 26, the number of grid points on the circle and their angular distribution varies, which immediately relates to the formed interference pattern. In order to obtain desired interference pattern 27, 28, 29, the grid points 24 may be carefully selected from the plurality of available grid points 21 on the complex plane.

In terms of number theory, the radius of the virtual circle 23, 25, 26 may relate to the field norms and the array of points on the grid may relate to the integer lattice. Therefore, the integer lattice method may be used for finding the lattice points or the beam orientations to obtain the desired interference pattern. By choosing a specific norm it is possible to determine points on the integer lattice. Here, the norm relates to the radius of the virtual circle 23, 25, 26 on the grid 21 as discussed above.

For example, in the square grid 22 by selecting the radius equal to √5 for field norm equal to 5, the virtual circle 23 is selected. On the virtual circle 23 lays eight grid points, which contribute to the selected grid points 24. By associating each of the selected grid points 24 on the virtual circle 23 with plane waves or quasi-plane waves or parallel wave fronts, an interference pattern 27 is obtained. The interference pattern 27 is a structured radiation pattern with a periodicity.

Further examples, in FIG. 2 the virtual circle 25 corresponds to radius equal to √13 for field norm equal to 13 and the virtual circle 26 corresponds to the radius equal to √25 for a field norm equal to 25. The interference patterns 28 and 29 correspond to the selected grid points 24 on the virtual circles 25 and 26, respectively. The number of grid points on the circle and their angular distribution is directly related to the selected virtual circle 23, 25, 26. The obtained interference patterns 27, 28, 29 are unique with different interstitial spaces or regions. Also, it can be seen that these interference patterns 27, 28, 29 vary depending on the selected radius of the virtual circle 23, 25, 26, respectively. Further, each of the interference patterns 27, 28, 29 offer high contrast.

In FIG. 3, an example embodiment of the method for a hexagonal grid arrangement 21 (or can also be considered as a triangular array of grid points) in the complex plane is shown. Each hexagonal grids 32 show concentric virtual circles on the left panel of FIG. 3. The highlighted virtual circles 33, 35, and 36 correspond to the radius √7, √13, and √19, respectively. For the hexagonal grids 31, the number of grid points and their angular distribution on the virtual circles 33, 35, 36 directly depends on the radius of the virtual circle. When the selected grid points 33, 35, and 36 are associated with the plane waves or quasi plane waves or parallel wave fronts, the interference patterns 37, 38, 39 in the real space are obtained. The interference patterns 37, 38, 39 correspond to the selected grid points 34 on the virtual circles 33, 35, and 36, respectively. Similar to square grid 22, the hexagonal grid 32 also offers unique interference patterns based on the selected radius of the virtual circles.

The method according to example embodiments covers the case with a planar geometry, i.e., where the incident beams and the resulting two-dimensional pattern are in the same plane. Further, the same inventive method can be extended to three-dimensional space.

Therefore, the present disclosure offers a method for dynamic manipulation of the interference patterns generated by the presented integer lattice method using modulation of the phases of the input beams. The generated interference pattern may be modulated by shifting the phase angle of the plane waves or quasi-plane waves or parallel wave fronts. The resulting radiation intensity of the phase-shifted plane waves or quasi-plane waves or parallel wave fronts in the complex plane is calculated as the sum of the plane waves or quasi plane waves or parallel wave fronts times its conjugate. This is done to simulate the actual physical interference pattern as would be generated by electromagnetic radiation. It is noted that phase shifting each beam with equal amount will not change the interference pattern as the shift is counteracted by the complex conjugate of the wave amplitudes when calculating the light intensity. Setting phase shifts at random, on the other hand, will just cause the translational symmetry of the interference pattern to disappear. Thus, in order to translate the pattern, while preserving the periodicity obtained according to the present disclosure, the phase shift may be synced across all input beams.

Figure 4A:
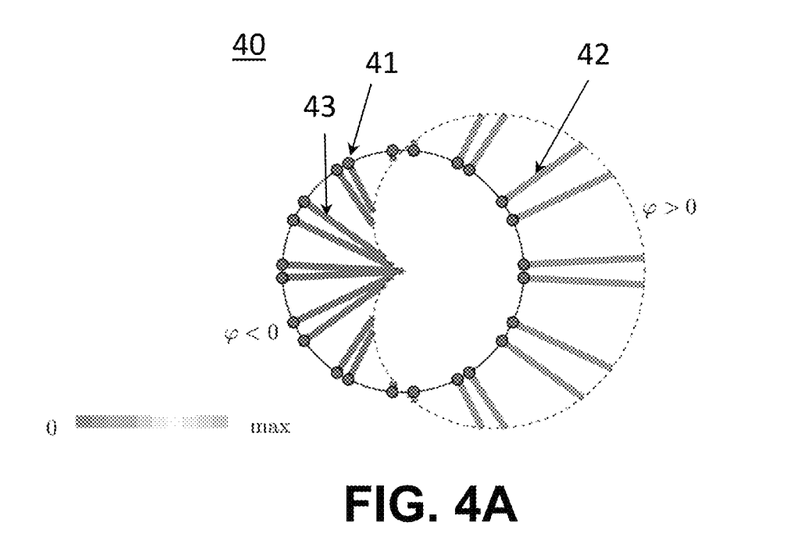
FIGS. 4A-4C show an interference pattern being translated by setting the phases of the input beams according to a cardioid curve, according to example embodiments.
Figure 4B:
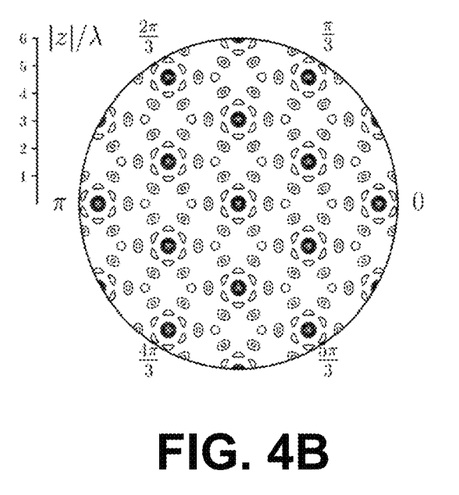
Figure 4C:
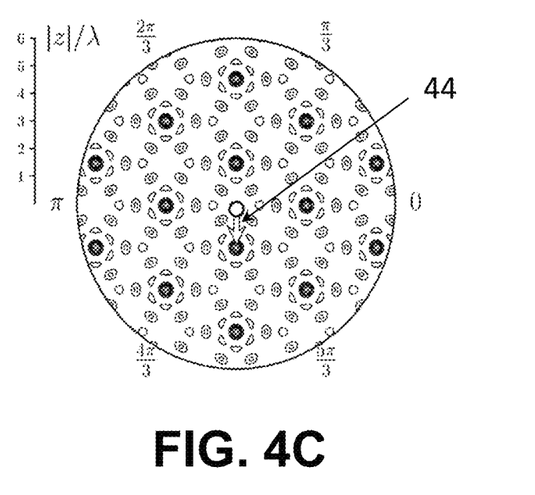

FIG. 4 shows an example embodiment of the translation of an interference pattern according to the present disclosure along with corresponding input phases. The phase shift is determined by multiplying the projection of each selected grid point, corresponding to the orientation angle of each incident beam 41 (gray dots), on the axis perpendicular to the desired direction of the translation 44 by the magnitude of the intended translation (in units of λ) 44. The magnitude of the phase shift is denoted by the length of the bar 42, 43 that is oriented radially with respect to the center of the input configuration 41. Graphically, the phase shifts are represented in a cardioid curve as shown by the dashed curve in FIG. 4A. By plotting the grid points 41 on the virtual circle in a radial fashion, lengths 42, 43 correspond to the magnitude of the phase shifts for each input beam. The light grey lines 42 represent a positive shift and dark grey lines 43 represent a negative shift.

As a further embodiment, for a three-dimensional configuration (not shown here), the scanning or translation of the interference pattern can likewise be achieved by phase modulating the incident light beams.

As an example embodiment of the first aspect, it is possible to switch between interference patterns by having multiple configurations of input beams and turning them on or off selectively. Alternatively, the orientation of the beams can be changed to other pre-computed configurations if the experimental embodiment allows this.

In FIG. 5, another example embodiment of the first aspect is illustrated. A two-dimensional planar arrangement is shown in FIG. 5A, wherein all the incident beams 51 are all on the same plane. The beams interfere at the center 54 and the resultant interference pattern also is on the same plane.

Figure 5A:
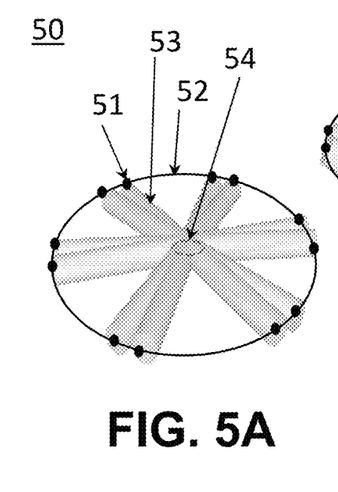
FIGS. 5A-5D show an illustration of two dimensional and three-dimensional beam arrangements, according to example embodiments.
Figure 5B:
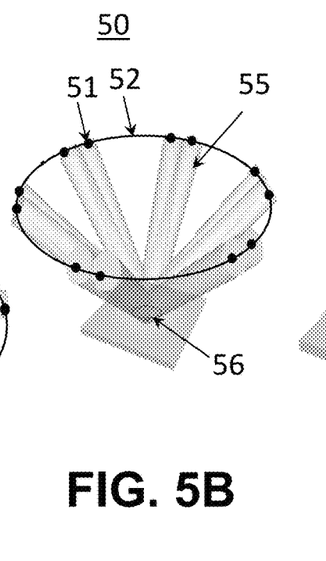
Figure 5C:
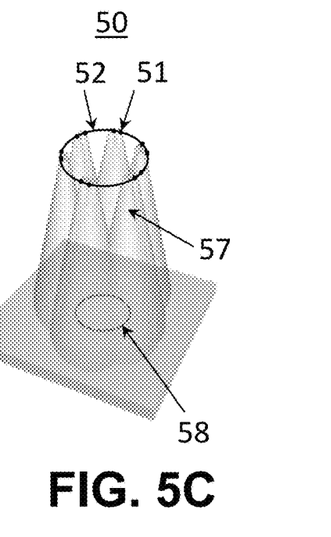
Figure 5D:
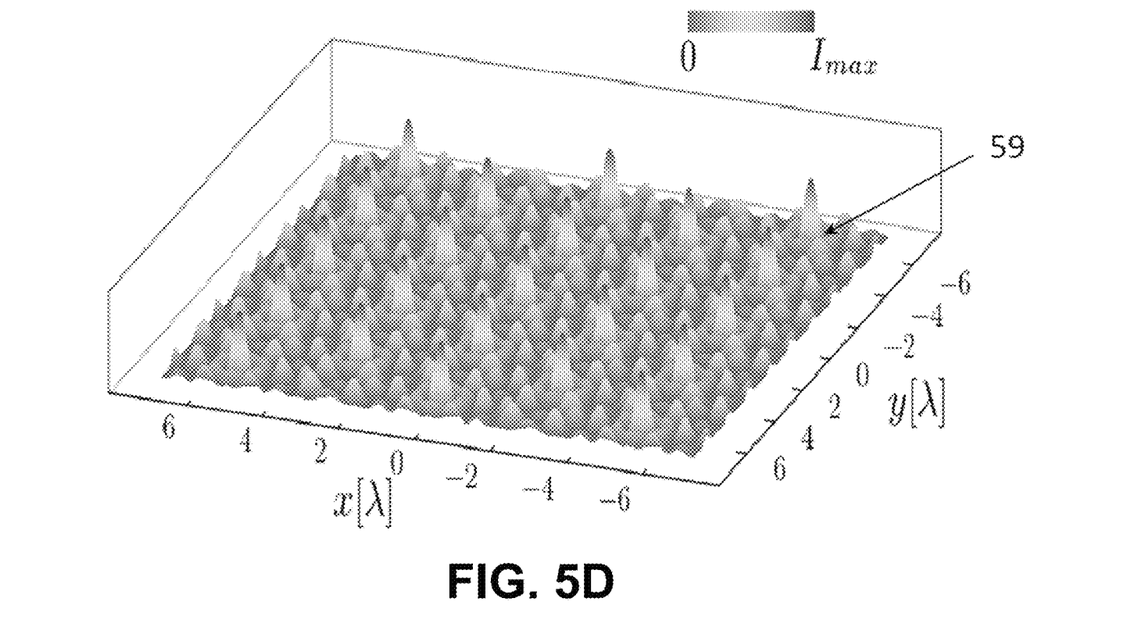

This principle can be extended to three-dimensions or generalized free space as shown in FIG. 5B and FIG. 5C. The incident beams 55 interfere at the center 56 in the 3D configuration in FIG. 5B. Further, the interference pattern at the center 58 is formed by diffracted beams 57 (shown in FIG. 5C). In all three cases, the interference pattern 59 may be generated as shown in FIG. 5D.

According to the first aspect, the interference pattern can be formed on any desired region for example, in vacuum, free space or central region of the light propagating medium or any device sample or material interface.

Figure 9A:
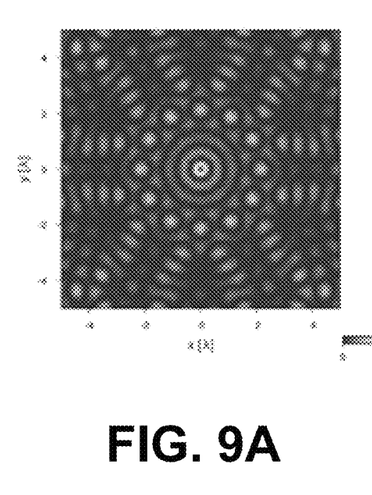
FIG. 9A shows the simulated intensity of a single Gaussian, according to example embodiments.
Figure 9B:
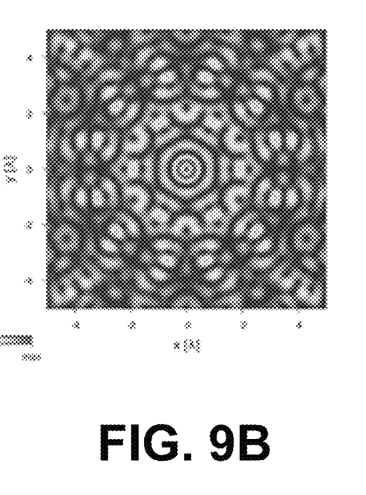
FIG. 9B shows the simulated intensity of a single annular spot, according to example embodiments.
Figure 9C:
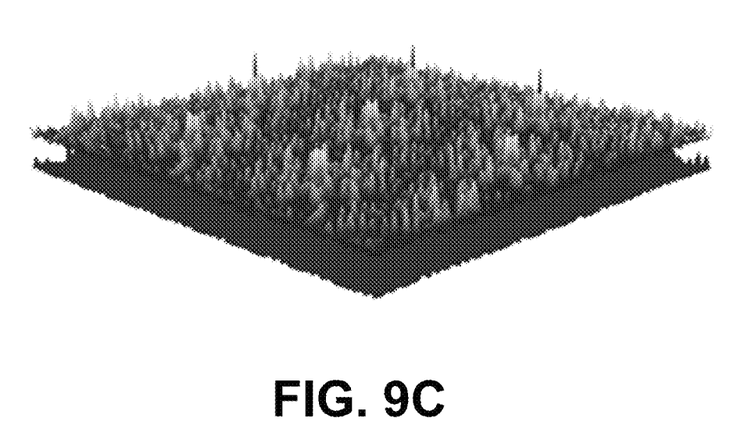
FIG. 9C shows a multi-focal spot-annulus interference pattern that may result from the combined usage of a single Gaussian and a single annular spot, according to example embodiments.

The first aspect can be extended to create interference spots with an annular shape that, combined with Gaussian spots, can be used, for example, to implement STED microscopy as shown in FIG. 9C.

Figure 6:
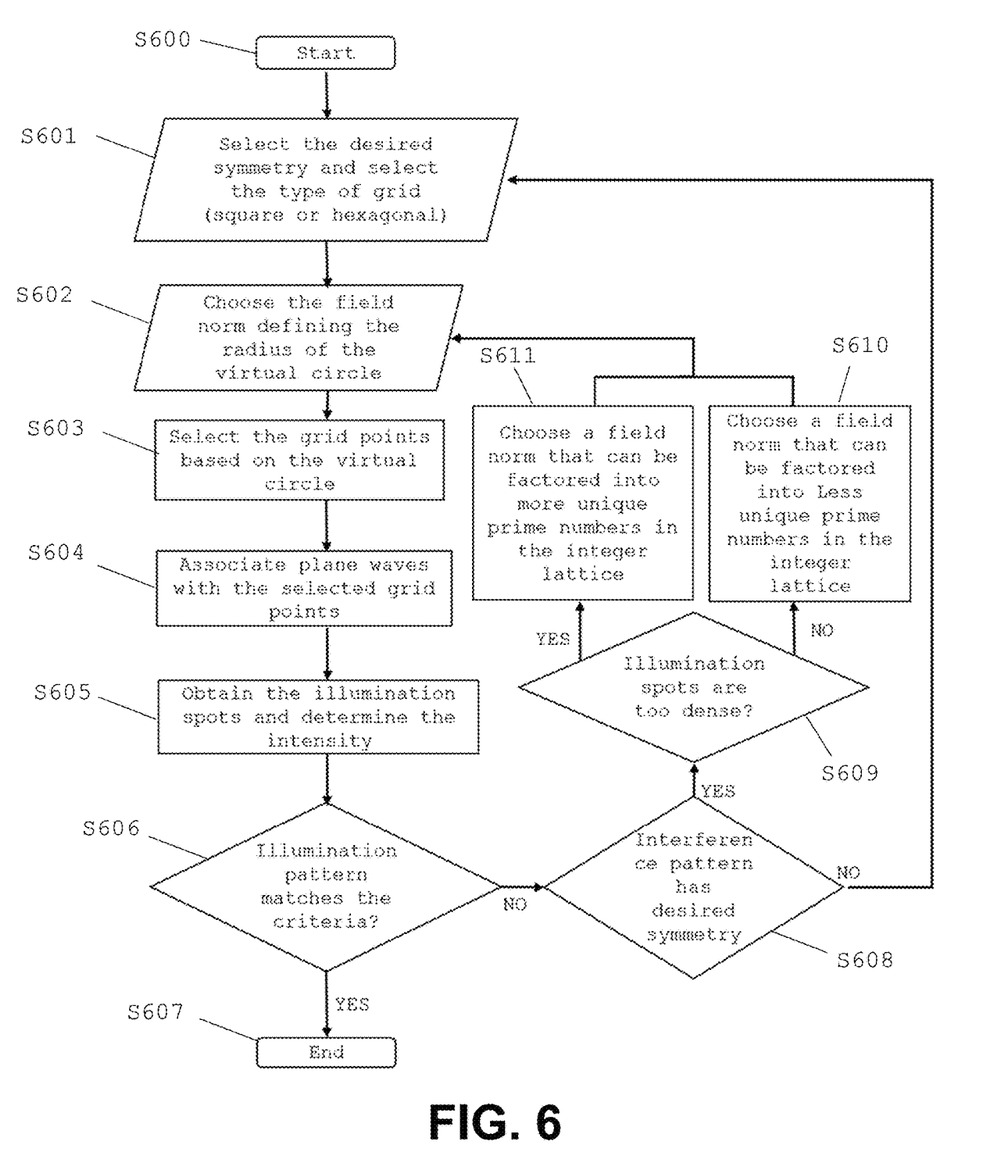
FIG. 6 shows a flowchart of the algorithm for generating a desired interference pattern, according to example embodiments.

A second aspect of the present disclosure is illustrated as a flowchart in FIG. 6. The flowchart provides an algorithm or programming code in order to carry out all the method steps as discussed above in a computer or a digital signal processor. A first step S600 initiates the algorithm. In a second step S601, a user or a program is allowed to select the desired symmetry of the interference pattern to be generated. Based on the desired symmetry, the type of grid (triangular, square, hexagonal or quasi-periodic) is further selected. Step S602 chooses the field norm defining the radius of the virtual circle. In a step S603, the grid points that lay on the selected virtual circle of the step S602 are selected. In a step S604, each of the selected grid points of the step S603 is associated with the direction of propagation of the plane waves or quasi plane waves or parallel wave fronts.

In a step S605, illumination spots are obtained by computing the intensity profile from the interfering plane waves or quasi plane waves or parallel wave. In a step S606, it is checked if the illumination spots match the desired criteria, for example, illumination spot spacing, sideband suppression. If the desired criteria are met, then the algorithm reaches an end step S607. If not, a step S608 is performed, which determines if the symmetry (for example square or hexagonal or triangular or quasi-periodic) of the interference pattern matches the desired symmetry. In the case that the symmetry of the pattern is not the desired symmetry, the algorithm proceeds to step S601. Hence, a re-selection of the symmetry is possible at this stage of the algorithm. In the case, the symmetry of the interference pattern is the desired symmetry, which means that other criteria are met, the algorithm proceeds to a step S609.

In the step S609, it is determined if the illumination spots are sufficiently separated in real space. In the case that, the spots are too dense, a value for the field norm may be chosen that would result in more grid points to be selected on the corresponding virtual circle. In number theory, this is achieved by selecting a number for the field norm that can be factored into more unique primes in the chosen integer lattice. This is done in step S611 and the algorithm further proceeds to the step S602, which performs a re-computation of the radius of the circle. In the other case that the grid points are too sparsely spaced, a value for the field norm may be chosen that would result in fewer grid points to be selected on the corresponding virtual circle. In number theory, this is achieved by selecting a number for the field norm that can be factored into fewer unique primes in the chosen integer lattice. This is done in step S610 and the algorithm further proceeds to the step S602, which performs a re-computation of the radius of the circle. Therefore, the algorithm according to the present disclosure effectively enables selecting the parameters to achieve the desired illumination pattern.

An example embodiment provides the determination of parameters in two dimensions and three dimensions. According to the integer lattice method, a grid in two dimensions can be mathematically represented as $\mathbb{Z}[\zeta_m]$ with $$\zeta_m = e^{\frac{2\pi i}{m}},$$

where $m \in \mathbb{Z}$. If L/K is a Galois extension, where $L = \mathbb{Q}(\zeta_m)$, the algebraic field that contains $\mathbb{Z}[\zeta_m]$, is the field extension of the rational numbers $K = \mathbb{Q}$, the norm of $\alpha \in L$ is computed as the product of all the Galois conjugates $\sigma$ of $\alpha$: $N_{L/K}(\alpha) = \Pi_{\sigma \in Gal(L/K)} \sigma(\alpha)$. Computer or other digital processor can determine all a, $b \in \mathbb{Z}$ such that the Euclidean norm (corresponding to the square of the radius of the virtual circle equals the field norm. This is written as $z\bar{z} = (a+b\zeta_m)(a+b\bar{\zeta}_m) = N_{L/K}(z)$ with $$\zeta_m = e^{\frac{2\pi i}{m}},$$

where m, $\in \mathbb{Z}$. The number of elements in the set of (a, b)'s for a given n, m, is the number of input beams. The argument of the grid points $(a+b\zeta_m)$ will determine the direction of the propagation of the input beams or plane waves or quasi-plane waves or parallel wave fronts. The number of grid points on the circle depends on the prime factorization of the value of the field norm in the given integer lattice. From the set of solutions, it is possible to choose the configuration best suited for any application.

Therefore, the variable parameters may be the symmetry of the grid and the radius of the virtual circle or the selection of grid points or the number of input plane waves or quasi-periodic waves or parallel wave fronts.

As a first example embodiment of a third aspect of the present disclosure, a device for generating an interference pattern is provided. The device 50 is configured to generate a periodic or quasi-periodic structured illumination pattern according to the method of the present disclosure. The device 50 consists of a plurality of light input ports that are associated with the selected grid points 51 and are configured to receive input light beams 53,55,57. Wherein the light beams 53,55,57 interfere at a center 54,56,58 generating an interference pattern 59. Especially, the input beams 51,55,57 may be quasi-plane waves or parallel light wave fronts. Further, in some embodiments the interference pattern 59 may be generated over any desired region such as vacuum, free space or the light propagating medium or any device, sample or material interface.

Figure 7A:
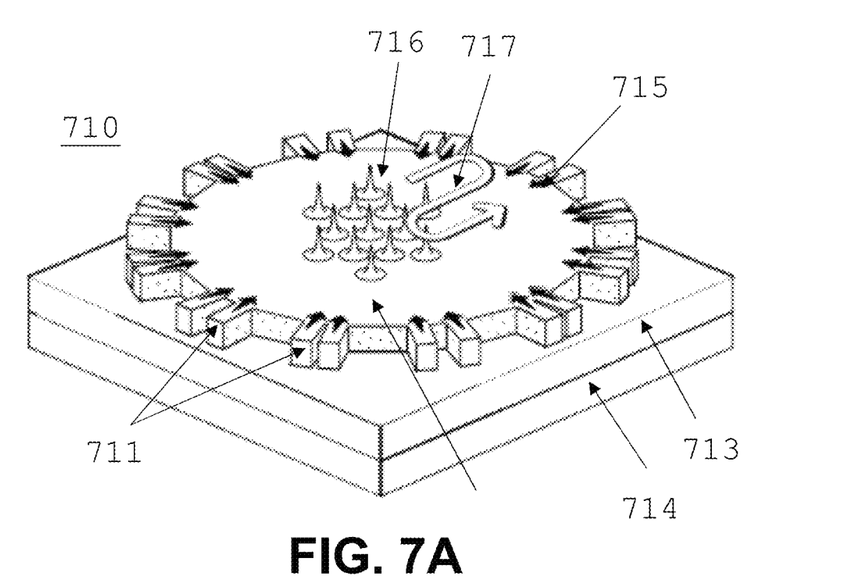
FIG. 7A shows a device, according to example embodiments.
Figure 7B:
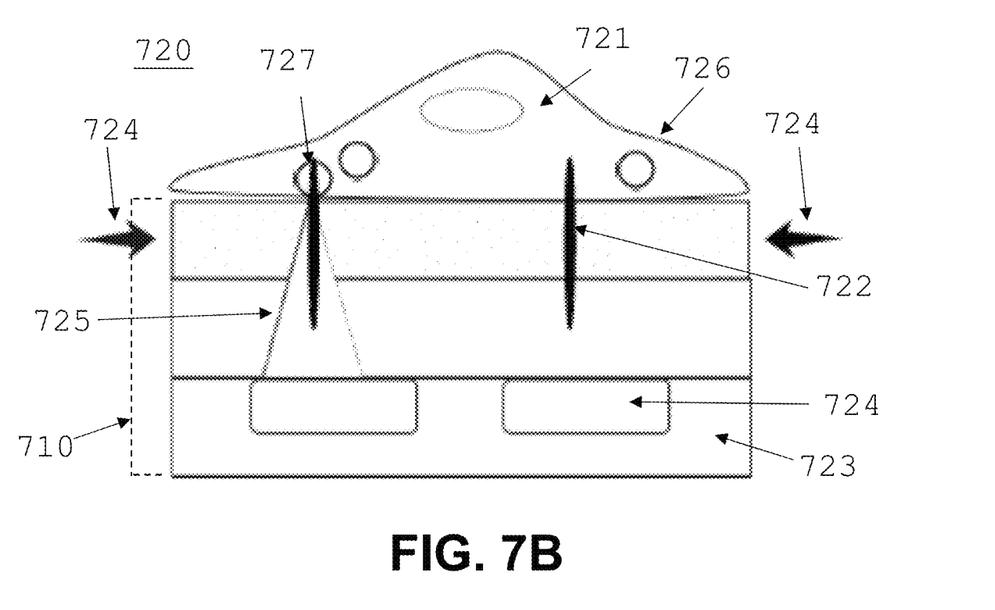
FIG. 7B shows a sample positioned on the device to measure a fluorescence response, according to example embodiments.

As a second example embodiment of the third aspect of the present disclosure, on-chip microscopy with sub-pixel resolution is provided. A device 710 configured to generate a (quasi-) periodic structured light pattern according to the disclosure is illustrated in FIG. 7A and FIG. 7B. The device 710 consists of a plurality of light input ports 711 oriented around an optical waveguide 712 with a bottom cladding 713. The optical waveguide 712 is fabricated over an array of light-sensitive areas 714. The optical waveguide 713 may confine the input light beams 715 to a single propagation plane. The optical waveguide 712 can have any arbitrary shape. The input beams 715 interfere at the center of the optical waveguide 712 to form interference pattern 716.

FIG. 7A illustrates a circular shaped optical waveguide central region 712. The input ports 711 provide at least partially coherent beams 715 to the imaging region 716 located at the center of the waveguide 712. In some embodiments, the waveguide 712 confines the light to a single propagation plane. An arrow 717 represents the scanning of the focal spots over the waveguide 712.

For example, the array of light-sensitive areas or imager 714 may be a complementary metal-oxide-semiconductor (CMOS) or a charge-coupled device (CCD).

The waveguide can be an optical slab waveguide or even a suitable arrangement of mirrors in free space or vacuum or any electromagnetic wave guiding device or structure.

For example, the optical waveguide 712 may be formed from SiN or any other suitable material, which is suitable for transporting over a broad spectral range, being essentially transparent to the visible light and/or infrared light. Therefore, it is suitable for integration monolithically on a semiconductor circuitry. A layer of SiN 712 may be formed without affecting an underlying semiconductor circuitry. Also, SiN has a suitable refractive index to facilitate total internal reflection in the optical waveguide 712. Alternatively, other suitable material or combinations of materials may form the optical waveguide 712.

The bottom cladding layer 713 may be formed from any suitable material having a relatively low refractive index so as to ensure that light propagating through the optical waveguide 712 is subjected to total internal reflection in an interface between the optical waveguide 712 and the bottom cladding layer 713. The bottom cladding layer may be $SiO_2$ or any other suitable material.

The plurality of input ports 711 of the optical waveguide 712 may allow very accurate control of the interference pattern 716 formed in the center of the optical waveguide 712. The number of input ports 711 may be chosen to match the selected grid points 24, 34 that in turn is based on the desired interference pattern as discussed above.

The light beams 715 from the input ports 711 interact to form a sparsely spaced array of illumination spots 716 on top of the optical waveguide 712, for example optical slab waveguide, to form an interference pattern 716 in the center of the waveguide 712. Additionally or alternatively, the optical waveguide 712 may comprise one or more mirrors to aid reflection of the light beams 715, which can further contribute to the formation of the interference pattern 716. The interference pattern 716 comprises at least one illumination spot 716. The illumination spots may have a circular or an elliptical shape in two dimensions.

Scanning 717 is achieved by modulating the phase of the input beams 715. Both the phase and amplitude of each input beams 715 can be controlled by a peripheral photonic integrated circuit (PIC) comprising, e.g., at least one phase modulators and/or at least one Mach-Zehnder interferometer switch. The modulation of the input beams 715 can be achieved for instance by thermal optical modulation with the use of heating elements or by use of an opto-electro-mechanical effect or by applying an electric or a magnetic field to the input ports 711 or any other means in the art. As an example, for visible light, the waveguide material may be silicon nitride or niobium oxide. Similarly, for infrared light, the waveguide material may be silicon. Alternatively, any suitable material can be selected as the waveguide material based on the operating spectral range.

For instance, the device 710 is suitable for detecting fluorescence light from a sample 721, which is in a close relation to the device 710, e.g., in contact with the device 710 as shown in FIG. 7B, i.e. configuration 720. The illumination spots 722 selectively illuminate portions of the sample 721. The changing interference pattern may move (as marked by the arrow 717) the illumination spots 722 in relation to the sample 721 in such a manner that the illumination spots 722 scan over the sample 721 for imaging the entire sample 726. The imager/image sensor 723 comprises an array of pixels 724 suitable for detecting the fluorescence or scattering response 725 from a part of the sample 727. The device may provide a filter (not shown) to selectively absorb or reflect the light of undesired wavelengths, whereas light of interest from the part of the sample 727 may transmit through the filter.

In a specific embodiment, as shown in FIG. 7B, each illumination spot 722 may coincide with one pixel 724 of the image sensor 723, hence providing a system analogous to multi-focal laser scanning microscopy. As a result, an optical spatial resolution of sub-pixel size can be achieved. It is not a strict requirement that each illumination spot may coincide with one pixel 724 of the image sensor 723. A suitable image reconstruction algorithm may be used to recover a high-resolution image.

A third example embodiment of the third aspect of the present disclosure is the proposed use of the structured illumination pattern obtained by the interference pattern even in the absence of the monolithically integrated pixel sensor array. A variation using a regular microscope comprising of an objective lens, optional optical filter, and pixel sensor array (e.g. CCD or CMOS camera) can be used for optical fluorescence or scattered light detection. The structured illumination resides still completely on a Photonic Integrated Circuit, which may allow for high surface-sensitive multi-focal scanning total internal reflection fluorescence (TIRF) based illumination without the need for expensive TIRF objective lens and sensitive alignment. A spatial optical resolution is better than the free-space diffraction limit due to the higher refractive index of the waveguide. Hence, a better resolution as compared to regular epi-fluorescence and confocal scanning fluorescence and TIRF epi-fluorescence and confocal scanning florescence microscopy is achieved. Multi-focal scanning allows an increased imaging speed and throughput as compared to single beam scanning, e.g. confocal fluorescence microscopy within a compact system, eliminating bulky, expensive and alignment sensitive free-space beam-shaping components.

Figure 8A:
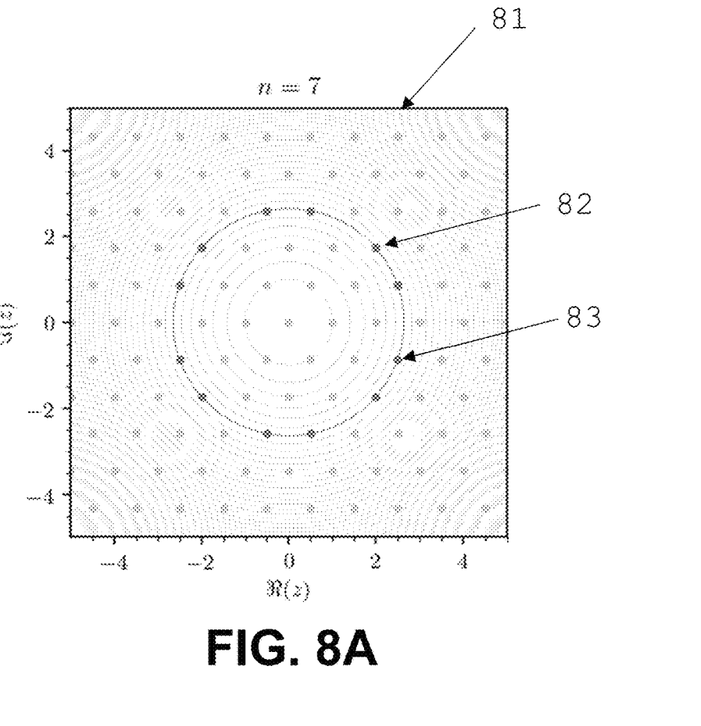
FIGS. 8A-8C show experimental verification of example devices in a three-dimensional system with diffracted beams as illustrated in FIG. 5C, according to example embodiments.
Figure 8B:
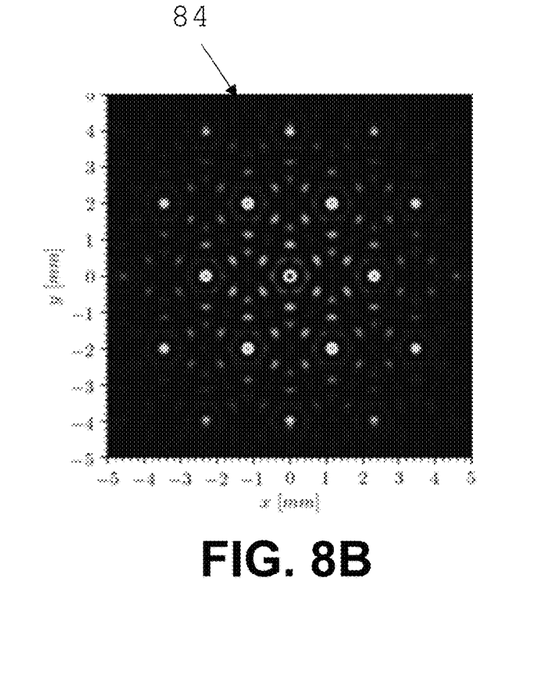
Figure 8C:
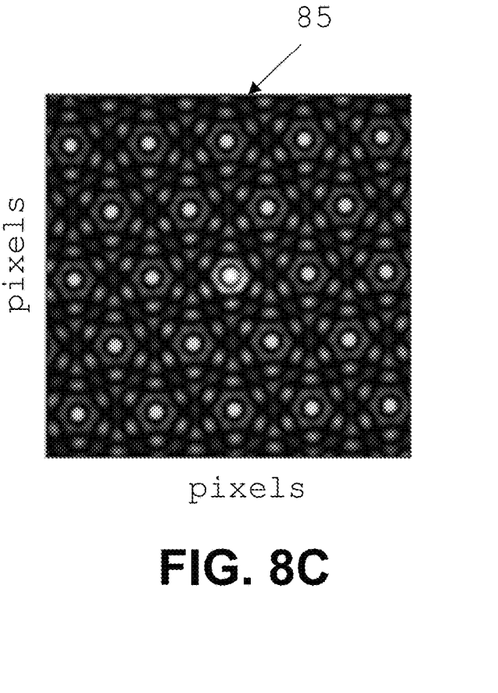

A fourth aspect of the present disclosure is to extend the method to a free space (three-dimensional) system. The generation of the desired illumination patterns based on the present disclosure in three-dimensional space is shown in FIGS. 8A-8C. The method can be achieved by implementing a 2D planar embodiment based on a Photonic Integrated Circuit. FIGS. 8A-8C show the experimental verification of the present disclosure in a 3D system. As previously discussed with respect to FIG. 5C, the interference pattern can be formed by diffracted beams. FIG. 8A shows a hexagonal grid 81 with selected grid spots 83 with a field norm n=7 lying on a virtual circle 83 with a radius=√7. The simulation of the interference pattern 84 using the FFT approach for solving the Fresnel-Kirchhoff integral for the input beam arrangement corresponding to the grid points with the field norm n=7, lying on the virtual circle with a radius=√7 is shown in FIG. 8B. The corresponding experimental interference pattern 85 is shown in FIG. 8C. It is seen that the experimental pattern 85 matches the simulated pattern 84 very well. The experimental interference pattern 85 is achieved by associating plane waves or quasi plane waves or parallel wave fronts with selected grid points 83. The experimental interference pattern 85 is obtained by allowing the interference of diffracted beams and using an amplitude mask with a hole diameter of 25 μm.

The embodiments of the present disclosure can be implemented by hardware, software, or any combination thereof. Various embodiments have been described above, it should be understood that they have been presented by way of example only, and not limitation. Numerous changes to the disclosed embodiments can be made in accordance with the disclosure herein without departing from the scope of the disclosure. Thus, the breadth and scope of the present disclosure should not be limited by any of the above-described embodiments. Rather, the scope of the disclosure should be defined in accordance with the following claims and their equivalents.

Although example embodiments have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired for any given or particular application.

What is claimed is:

1. A method comprising:
computing a set of grid points in a complex plane representing a grid with a desired symmetry;
selecting a radius of a virtual circle;
selecting a set of grid points in the complex plane that lies on the virtual circle centered around a virtual center point;
associating an argument of each grid point of the selected set of grid points in the complex plane with a propagation direction of plane waves or quasi plane waves or parallel wave fronts;
obtaining an interference pattern that is a superposition of the plane waves or quasi plane waves or parallel wave fronts; and
providing input beams of electromagnetic radiation to a plurality of electromagnetic radiation input ports such that the obtained interference pattern is generated using multi-beam interference of electromagnetic radiation.

2. The method according to claim 1, wherein the plane waves or quasi plane or parallel wave fronts are modulated by shifting a phase angle.

3. The method according to claim 1, further comprising:
calculating the electromagnetic radiation intensity of the interference pattern; and
determining if the calculated intensity pattern has a desired symmetry, sideband suppression, or distance between the interference spots.

4. The method according to claim 1, further comprising tuning the symmetry of the array of grid points to obtain a desired symmetry of the interference spot positions.

5. The method according to claim 1, further comprising tuning the radius of the virtual circle in the complex plane to obtain a desired distancing of the interference spots.

6. The method according to claim 1, further comprising arranging at least partially coherent input beams of electromagnetic radiation such that they have a direction of the wavefront that is the argument of the selected grid points on the selected virtual circle.

7. The method according claim 1, further comprising:
manipulating the illumination spots by tuning the angle of incidence of the input beams; or
modulating of phases or amplitude of the input beams.

8. The method according to claim 1, further comprising determining phase shifts of the input beams by multiplying the projection of each selected grid point, corresponding to an orientation angle of each of the input beams, on an axis perpendicular to a desired direction of an intended translation of the interference pattern by the magnitude of the intended translation.

9. The method according to claim 1, further comprising changing the interference pattern dynamically.

10. The method according to claim 2, further comprising tuning the phase of the plane waves or quasi plane waves or parallel wave fronts, as to give them a helical phase to obtain an annular interference spot.

11. The method according to claim 1, wherein the virtual circle is a virtual sphere and the complex plane is a three-dimensional space and the interference pattern is a three-dimensional interference pattern of interference spots.

12. A non-transitory, computer-readable medium having instructions stored thereon, wherein the instructions, when executed by a processor, cause the processor to carry out the method according to claim 1.

13. A device comprising a plurality of electromagnetic radiation input ports configured to receive input radiation beams and cause the input radiation beams to interfere at a center, which generates an interference pattern, and wherein causing the input radiation beams to interfere at the center comprises:
computing a set of grid points in a complex plane representing a grid with a desired symmetry;
selecting a radius of a virtual circle;
selecting a set of grid points in the complex plane that lies on the virtual circle centered around a virtual center point;
associating an argument of each grid point of the selected set of grid points in the complex plane with a propagation direction of plane waves or quasi plane waves or parallel wave fronts; and
obtaining the interference pattern that is a superposition of the plane waves or quasi plane waves or parallel wave fronts.

14. The device according to claim 13,
wherein the plurality of light input ports is oriented around an optical waveguide for receiving the input light beams,
wherein the electromagnetic radiation input ports are configured to provide waves forming illumination spots by the interference pattern,
wherein the illumination spots illuminate a sample, and
wherein the virtual center point is aligned with the center of the waveguide and a detector configured to detect light from the illuminated sample above the waveguide.

15. The device according to claim 13, further comprising at least one phase modulator or at least one switch for phase shifting or altering the magnitude of at least one of the input radiation beams, wherein the at least one phase modulator or the at least one switch for phase shifting or altering the magnitude of at least one of the input radiation beams is configured to scan the interference spots.

16. The device according to claim 13, wherein causing the input radiation beams to interfere at the center further comprises changing the interference pattern dynamically.

17. The device according to claim 13, wherein causing the input radiation beams to interfere at the center further comprises modulating the plane waves or quasi plane or parallel wave fronts by shifting a phase angle.

18. The device according to claim 13, wherein causing the input radiation beams to interfere at the center further comprises:
calculating the electromagnetic radiation intensity of the interference pattern; and
determining if the calculated intensity pattern has a desired symmetry, sideband suppression, or distance between the interference spots.

19. The device according to claim 13, wherein causing the input radiation beams to interfere at the center further comprises tuning the symmetry of the array of grid points to obtain a desired symmetry of the interference spot positions.

20. The device according to claim 13, wherein causing the input radiation beams to interfere at the center further comprises tuning the radius of the virtual circle in the complex plane to obtain a desired distancing of the interference spots.

\* \* \* \* \*